United States Patent
Yang et al.

(10) Patent No.: US 7,494,895 B2
(45) Date of Patent: Feb. 24, 2009

(54) METHOD OF FABRICATING A THREE-DIMENSIONAL MOSFET EMPLOYING A HARD MASK SPACER

(75) Inventors: Hung-Mo Yang, Gyeonggi-do (KR); Keun-Nam Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 340 days.

(21) Appl. No.: 11/086,076

(22) Filed: Mar. 21, 2005

(65) Prior Publication Data
US 2005/0215016 A1 Sep. 29, 2005

(30) Foreign Application Priority Data
Mar. 23, 2004 (KR) .............. 10-2004-0019762

(51) Int. Cl.
*H01L 21/76* (2006.01)
(52) U.S. Cl. .............. 438/437; 438/242; 438/197; 438/435
(58) Field of Classification Search ........ 438/242, 438/197, 435, 437
See application file for complete search history.

(56) References Cited

U.S. PATENT DOCUMENTS

| | | | | |
|---|---|---|---|---|
| 5,817,562 A * | 10/1998 | Chang et al. | ............. | 438/305 |
| 6,074,908 A * | 6/2000 | Huang | ............. | 438/241 |
| 6,228,770 B1 * | 5/2001 | Pradeep et al. | ............. | 438/692 |
| 6,551,937 B2 * | 4/2003 | Jun et al. | ............. | 438/694 |
| 2003/0141546 A1 | 7/2003 | Maegawa | | |
| 2005/0093075 A1 * | 5/2005 | Bentum et al. | ............. | 257/368 |

FOREIGN PATENT DOCUMENTS

| | | |
|---|---|---|
| KR | 2002-0018059 | 3/2002 |
| KR | 2002-0096654 | 12/2002 |
| WO | WO 03/003470 A2 | 1/2003 |

OTHER PUBLICATIONS

Wolf et al., "Silicon Processing fo the VLSI Era", 2000, Lattice Press, 2nd Ed., vol. 1, pp. 202-206.*
English language abstract of Korean Publication No. 2002-0018059.
English language abstract of Korean Publication No. 2002-0096654.

* cited by examiner

*Primary Examiner*—Matthew Smith
*Assistant Examiner*—Sonya D McCall Shepard
(74) *Attorney, Agent, or Firm*—Marger Johnson & McCollom, P.C.

(57) ABSTRACT

A method of fabricating a 3D field effect transistor employing a hard mask spacer includes forming a hard mask pattern on a semiconductor substrate. The semiconductor substrate is etched using the hard mask pattern as an etch mask to form a trench that defines an active region. A trench oxide layer and a liner are sequentially formed on the semiconductor substrate, and an isolation layer is formed to fill the trench. An upper surface of the isolation layer may by recessed below an upper surface of the hard mask pattern. A hard mask spacer is formed that covers sidewalls of the hard mask pattern. Some portions of the isolation layer where an etching is blocked by the hard mask spacer remain on sidewalls of the channel region, respectively, thereby preventing the liner from being damaged by etching.

21 Claims, 15 Drawing Sheets

METHOD OF FABRICATING A THREE-DIMENSIONAL MOSFET EMPLOYING A HARD MASK SPACER

CROSS-REFERENCE TO RELATED APPLICATION

This application claims the benefit of Korean Patent Application No. 2004-19762, filed Mar. 23, 2004, the disclosure of which is hereby incorporated herein by reference in its entirety.

BACKGROUND OF THE INVENTION

1. Field of the Invention

The present invention relates to a method of fabricating a semiconductor device and, more particularly, to a method of fabricating a three-dimensional (3D) MOSFET employing a hard mask spacer.

2. Description of the Related Art

A semiconductor device has discrete devices, such as a MOS transistor, employed as a switching device. As the semiconductor device becomes more integrated, the MOS transistor becomes scaled down. Consequently, a short channel effect is generated because a channel length of the MOS transistor is reduced.

In general, a method of doping channel ions in high concentration into a channel region is used to prevent a reduction of a threshold voltage due to the short channel effect. However, when the channel ions are doped at a high concentration, channel resistance increases to reduce a current driving capability.

Therefore, to reduce the short channel effect, research has been made into a three-dimensional field effect transistor. In particular, research on a Fin field effect transistor with which perfect depletion may be obtained due to the narrow channel width has been made.

The method of fabricating the three-dimensional field effect transistor was disclosed in U.S. Patent Laid-Open No. 2003/0,141,546(A1) by Maegawa, entitled "MOS semiconductor and Method of manufacturing the same".

FIGS. 1 to 6 are cross-sectional views illustrating methods of fabricating the three-dimensional field effect transistor disclosed in the U.S. Patent Laid-Open No. 2003/0,141,546 (A1).

Referring to FIG. 1, a semiconductor substrate 1 is prepared. A substrate oxide layer 6 is formed on a main surface of the semiconductor substrate 1 by a thermal oxidation process at 1000° C. Further, a mask nitride layer 7 is formed on the substrate oxide layer 6.

Referring to FIG. 2, the substrate oxide layer 6 and the mask nitride layer 7 are patterned to have a flat shape of semiconductor layer 13 including a channel region and source and drain regions.

Next, the main surface of the semiconductor substrate 1 is selectively etched using the patterned substrate oxide layer 6 and mask nitride layer 7 as an etch mask. Consequently, the main surface is selectively recessed. In particular, a trench is formed around the semiconductor layer 13.

Here, pattern shapes of the substrate oxide layer 6 and the mask nitride layer 7 are determined to have a width, which corresponds to a channel width in the semiconductor layer 13, less than or equal to twice the maximum channel depletion layer.

Referring to FIG. 3, an oxide layer, which is to be an isolation layer 2, is deposited on the semiconductor substrate 1 by HDP-CVP to cover the semiconductor layer 13. Next, the isolation layer 2 is removed by a chemical mechanical polishing (CMP) method until an upper surface of the mask nitride layer 7 is exposed.

Referring to FIG. 4, a resist pattern (not shown) is formed on the semiconductor substrate 1 having the isolation layer 2. Subsequently, selective etching is performed using the resist pattern as an etch mask. As a result, the upper surface of the isolation layer 2 is recessed downward in the regions adjacent to a pair of sidewalls of some regions of the semiconductor layer 13, which is to be the channel region.

Referring to FIG. 5, the mask nitride layer 7 and the substrate oxide layer 6 are removed by etching with a phosphoric acid ($H_3PO_4$) solution and a hydrofluoric acid (HF) solution.

Referring to FIG. 6, a gate insulating layer 3 is formed on the entire surface of the intermediate structure obtained after the step of FIG. 5, by a thermal oxidation process. As a result, the pair of sidewalls and the upper surface of some regions of the semiconductor layer 13 to be the channel region 5 are covered by the gate insulating layer 3. Next, a polysilicon layer, which is to be a gate electrode 4, is deposited. Next, the polysilicon layer is patterned to have a predetermined pattern by photolithography and plasma processes. As a result, the gate electrode 4 is formed.

According to the method disclosed in the U.S. Patent Laid-Open No. 2003/0,141,546(A1), the sidewalls as well as the upper surface of the channel region 5 are covered by the gate electrode 4. Further, the channel region 5 may be formed to have a width less than or equal to twice that of the maximum depletion layer. Therefore, according to the above method, it is possible to improve the short channel effect.

However, as illustrated with reference to FIG. 5, in the above method, the isolation layer adjacent to the sidewalls of some regions of the semiconductor layer 13 is recessed, and then the mask nitride layer 7 is removed. Here, the mask nitride layer 7 is removed with a phosphoric acid solution. However, while removing the mask nitride layer, the semiconductor layer 13 may be damaged by the phosphoric acid solution. In particular, when the semiconductor layer 13 has a width less than or equal to twice that of the maximum depletion layer, the damage of the semiconductor layer 13 may lead to a fatal defect in transistor operation.

Further, before the isolation layer 2 is deposited, a trench oxide layer and a liner may be formed on the inner wall of the trench to prevent the semiconductor layer 13 from being damaged. The liner serves to protect the trench oxide layer while the isolation layer 2 is recessed. In addition, the trench oxide layer prevents the semiconductor layer 13 from being damaged while the mask nitride layer 7 is removed. However, while the isolation layer 2 is recessed, the liner may be damaged, and the trench oxide layer may also be damaged. As a result, while the mask nitride layer 7 is removed with the phosphoric acid solution, the semiconductor layer 13 may be damaged. Consequently, while the isolation layer 2 is recessed, it is necessary to prevent the liner from being damaged.

SUMMARY OF THE INVENTION

An embodiment of the invention provides a method of fabricating a three-dimensional field effect transistor capable of preventing damage to sidewalls of a channel region by etching.

Another embodiment of the invention provides a method of fabricating a three-dimensional field effect transistor capable of preventing channel ions from being injected into source and drain regions.

In one embodiment, the invention is directed to a method of fabricating a three-dimensional (3D) thin film transistor. The method includes forming a hard mask pattern on a semiconductor substrate. The semiconductor substrate is etched using the hard mask pattern as an etch mask to form a trench that defines an active region. A trench oxide layer and a liner are sequentially formed on the semiconductor substrate having the trench. An isolation layer is formed to fill the trench. Here, an upper surface of the isolation layer is recessed down below an upper surface of the hard mask pattern. Next, a hard mask spacer is formed that covers sidewalls of the hard mask pattern. A mask pattern having an opening that crosses the hard mask pattern is formed on the semiconductor substrate having the hard mask spacer. Next, the isolation layer is etched using the mask pattern, the hard mask pattern and the hard mask spacer as etch masks to define a channel region. Accordingly, some portions of the isolation layer where the etching is blocked by the hard mask spacer remain on sidewalls of the channel region, respectively, thereby preventing the liner from being damaged by etching.

Further, the method may further include exposing an upper surface of the active region and the sidewalls of the channel region. Next, a gate electrode is formed that covers the upper surface of the active region and the sidewalls of the channel region and is insulated from the channel region.

In one embodiment, forming the gate electrode may include forming a gate insulating layer that covers the upper surface of the active region and the sidewalls of the channel region. A gate conductive layer is formed on the semiconductor substrate having the gate insulating layer; and the gate conductive layer is patterned. In addition, high-concentration impurity ions may be implanted into the active region using the gate electrode as an ion implantation mask to form source/drain regions. Meanwhile, spacers may be formed on the sidewalls of the gate electrode before implanting the high-concentration impurity ions.

In one embodiment, forming the hard mask pattern may include forming a hard mask layer on the semiconductor substrate. The hard mask pattern may be patterned using photolithography and etching processes. In addition, at least some of the active region may be defined to have a width less than or equal to twice that of a maximum deletion layer. Some regions of the hard mask pattern that corresponds to at least some of the active region may be formed to have a width that corresponds to the above width. Further, the channel region may be defined within the at least some regions. Accordingly, a FinFET, which may be perfectly depleted, may be fabricated.

In one embodiment, a buffer layer may be formed on the semiconductor substrate before the hard mask layer is formed. The buffer layer relieves stress between the hard mask layer and the semiconductor substrate.

In one embodiment, after the hard mask spacer is formed, a gap filling layer may be formed that covers sidewalls of the hard mask spacer. Forming the gap filling layer may include forming an insulating layer on the semiconductor substrate having the hard mask spacer. The insulating layer is planarized until the upper surface of the hard mask pattern is exposed. Consequently, the gap filling layer is formed whose upper surface has substantially the same height as the upper surface of the hard mask pattern. Accordingly, a mask pattern having an opening that crosses the hard mask pattern is easily formed.

In one embodiment, exposing the upper surface of the active region and the sidewalls of the channel region may include removing the mask pattern. Subsequently, some portions of the isolation layer, the hard mask pattern, the hard mask spacer and the liner are removed. Next, the trench oxide layer that covers the sidewalls of the channel region is removed. Here, when the buffer layer is formed on the semiconductor substrate, the buffer layer that covers the upper surface of the active region is removed. The buffer layer may be removed together with the trench oxide layer.

In one embodiment, before or after the mask pattern is removed, channel ions may be implanted into the channel region. In the active region other than the channel region, the channel ions are blocked from being injected due to the mask pattern and/or the hard mask pattern.

In one embodiment, the semiconductor substrate may be thermally oxidized before the semiconductor substrate is etched using the hard mask pattern as an etch mask. Consequently, the thermal oxidation layer is formed on the upper surface of the semiconductor substrate to make corners of the active region rounded. Accordingly, while the transistor is in operation, an electric field is prevented from being concentrated on the corners of the active region.

BRIEF DESCRIPTION OF THE DRAWINGS

The foregoing and other objects, features and advantages of the invention will be apparent from the more particular description of a preferred embodiment of the invention, as illustrated in the accompanying drawing. The drawing is not necessarily to scale, emphasis instead being placed upon illustrating the principles of the invention.

DETAILED DESCRIPTION OF THE INVENTION

Figure 1:
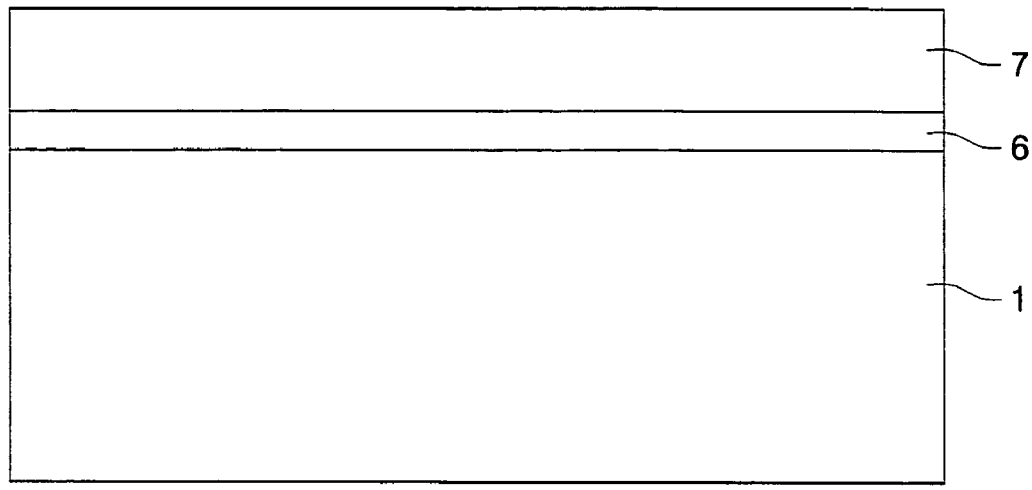
FIGS. 1 to 6 are cross-sectional views illustrating a conventional method of fabricating a three-dimensional MOSFET.
Figure 2:
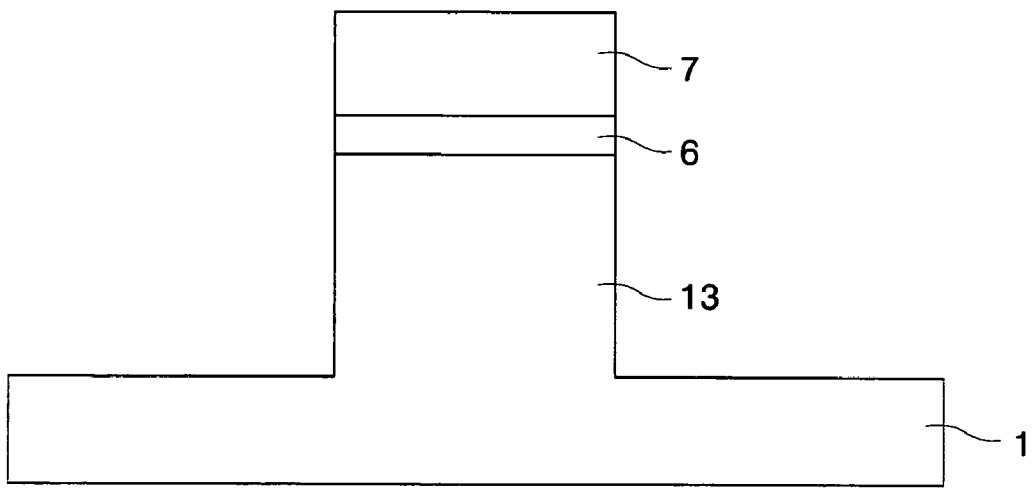
Figure 3:
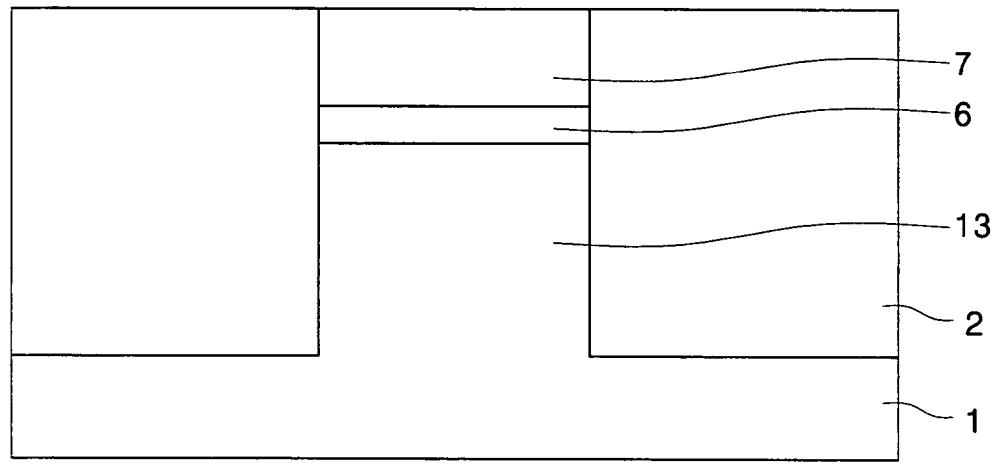
Figure 4:
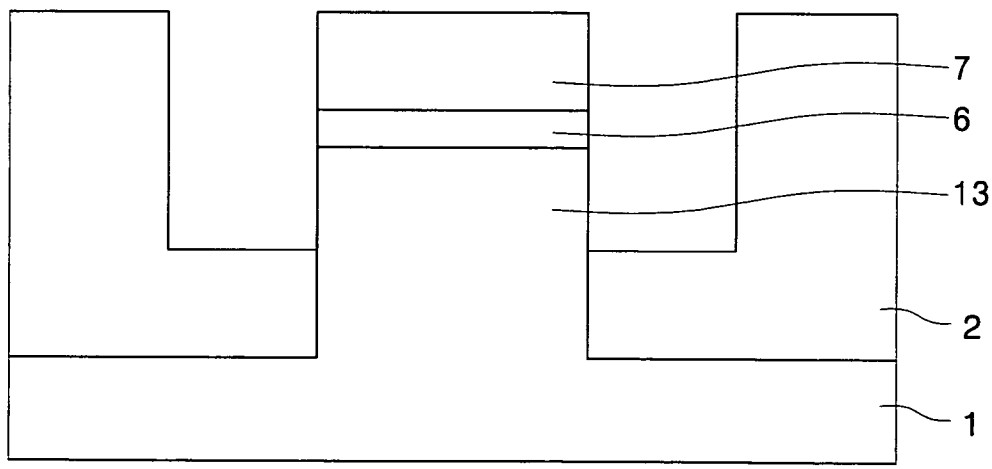
Figure 5:
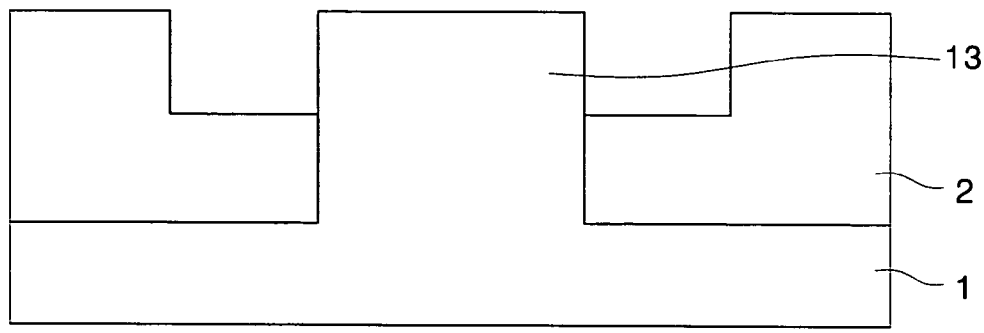
Figure 6:
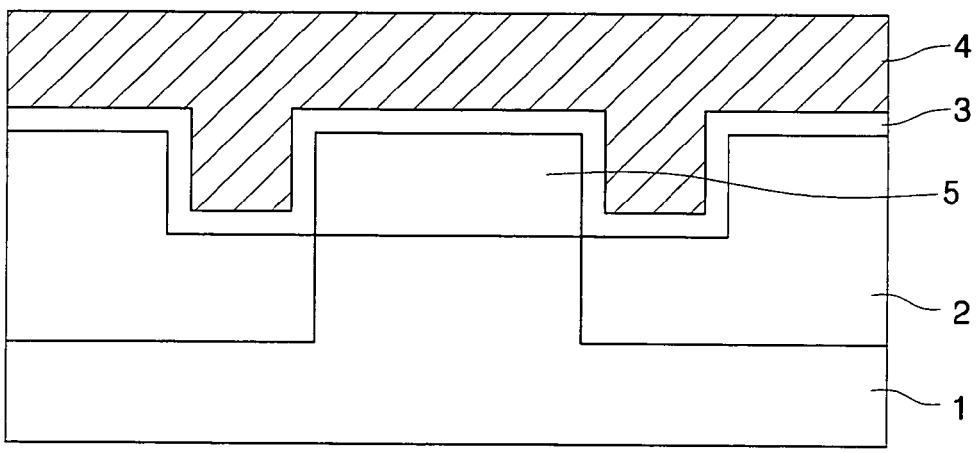

The present invention will now be described more fully hereinafter with reference to the accompanying drawings, in which exemplary embodiments of the invention are shown. In the drawings, the thickness of the layers and regions are exaggerated for clarity.

Figure 7:
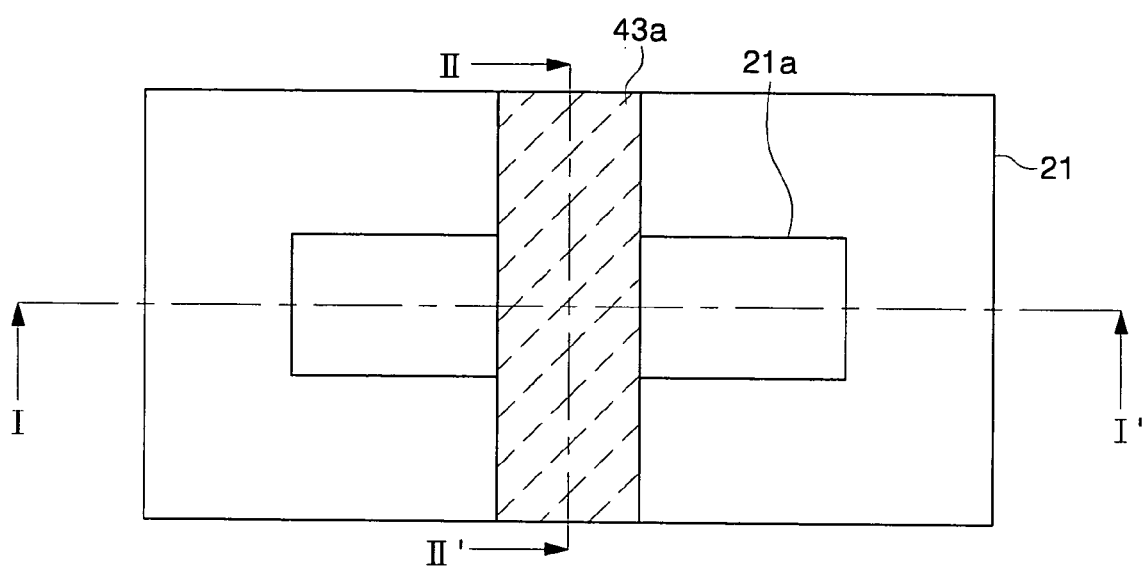
FIG. 7 is a layout illustrating a three-dimensional MOSFET in accordance with an exemplary embodiment of the present invention.

FIG. 7 is a layout illustrating a three-dimensional field effect transistor in accordance with an exemplary embodiment of the present invention; and FIGS. 8A to 18B are cross-sectional views illustrating a method of fabricating a three-dimensional MOSFET in accordance with an exemplary embodiment of the present invention. In reference numbers of FIGS. 8a to 18b, suffixes such as "A" and "B" refer to cross-sectional views taken along the lines I-I' and II-II' of FIG. 7, respectively.

Figure 8A:
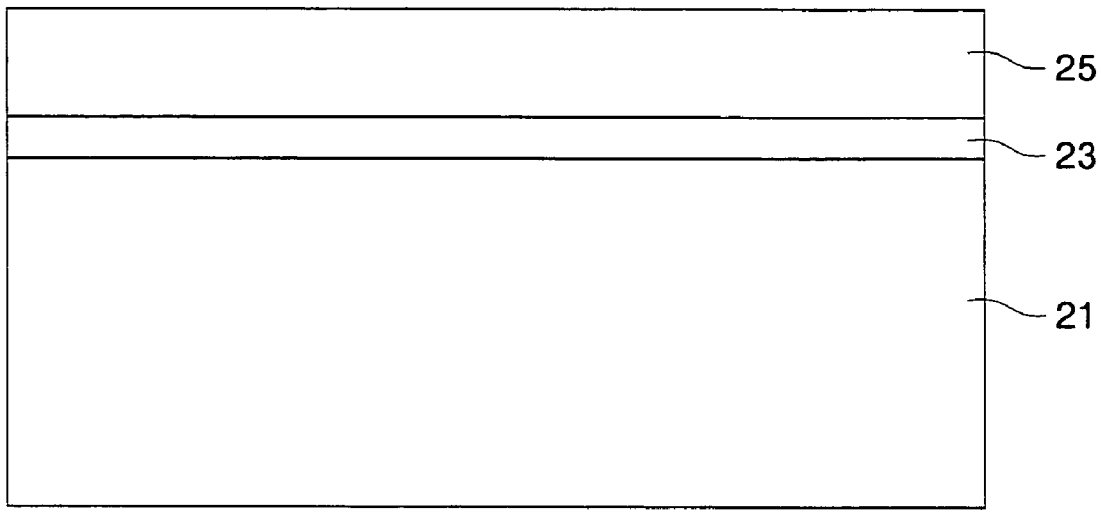
FIGS. 8A to 18B are cross-sectional views taken along the lines I-I' and II-II' of FIG. 7, illustrating a method of fabricating a three-dimensional MOSFET in accordance with an exemplary embodiment of the present invention.
Figure 8B:
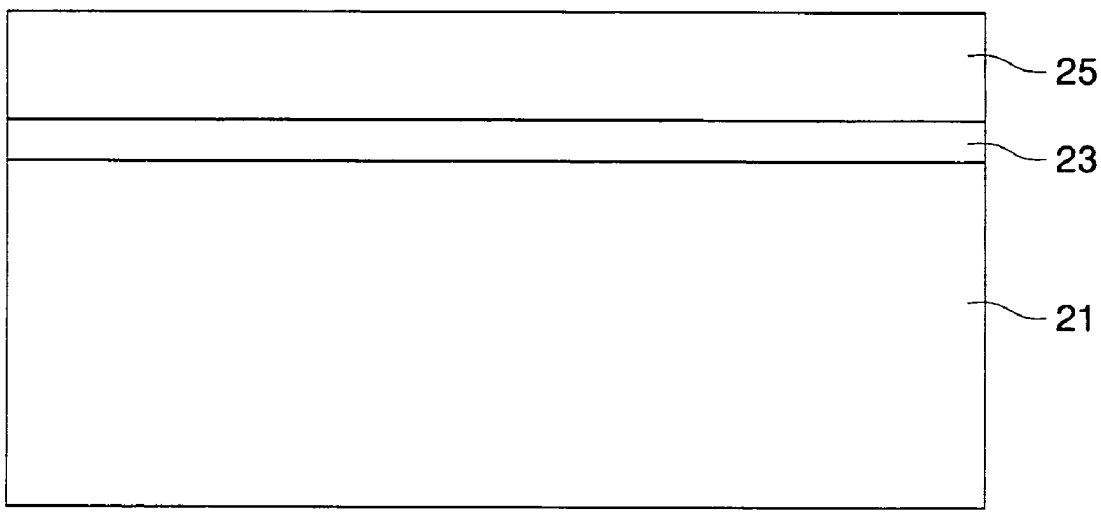

Referring to FIGS. 7, 8A and 8B, a hard mask layer 25 is formed on a semiconductor substrate 21. The semiconductor substrate 21 may be a silicon substrate or a silicon-on-insulator (SOI) substrate. Further, the hard mask layer 25 may be made of silicon nitride (SiN).

Before the hard mask layer 25 is formed, a buffer layer 23 may be formed on the semiconductor substrate 21. The buffer layer 23 may be formed by thermally oxidizing the semiconductor substrate 21. The buffer layer 23 serves to relieve stress between the hard mask layer 25 and the semiconductor substrate 21.

Figure 9A:
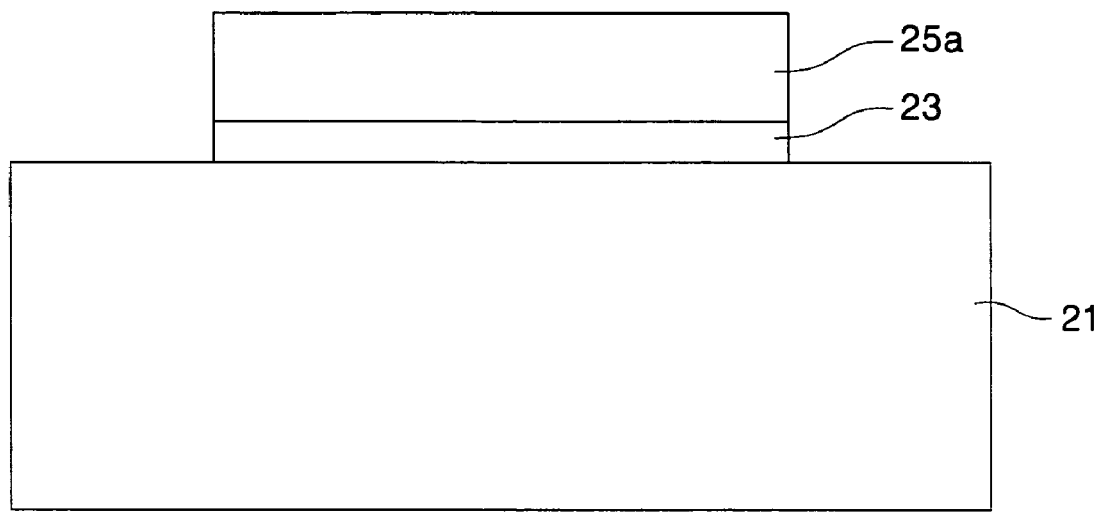
Figure 9B:
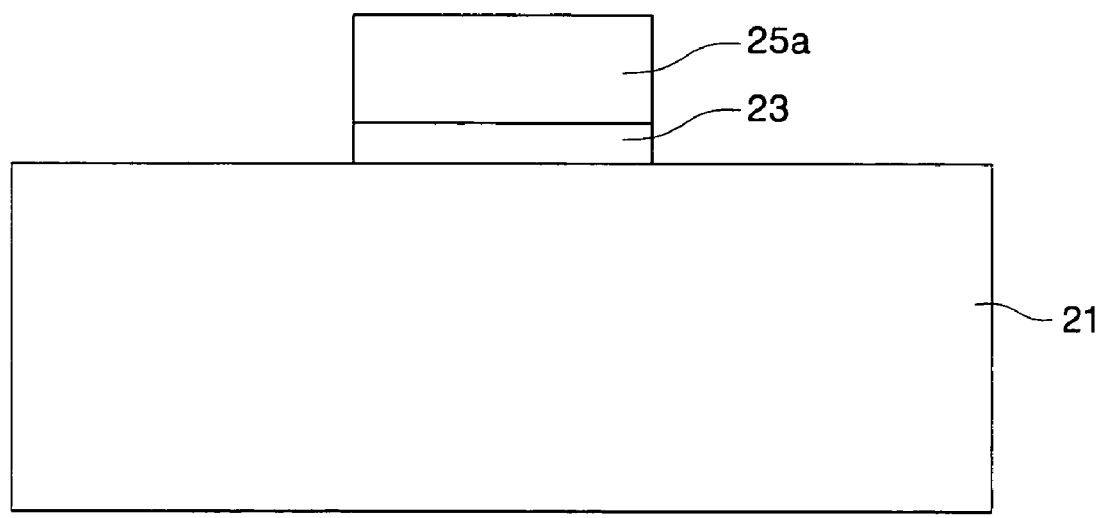

Referring to FIGS. 7, 9A and 9B, the hard mask layer 25 is patterned to form a hard mask pattern 25a. The hard mask layer 25 may be patterned by photolithography and etching processes. Here, an anti-reflective coating layer (not shown) and a photoresist layer may be formed on the hard mask layer 25 to pattern the hard mask layer 25. The anti-reflective coating layer may be formed of an organic anti-reflective coating layer. The photoresist layer is patterned by photolithography and development processes to form a photoresist pattern (not shown). The hard mask layer 25 is then etched using the photoresist pattern as an etch mask. Here, the buffer layer 23 may be etched also.

Further, the semiconductor substrate 21 exposed after etching the buffer layer 23 may be thermally oxidized. As a result, a thermal oxidation layer (not shown) is formed on the exposed semiconductor substrate 21. Some of the thermal oxidation layer is formed on the semiconductor substrate below the hard mask pattern 25a.

Figure 10A:
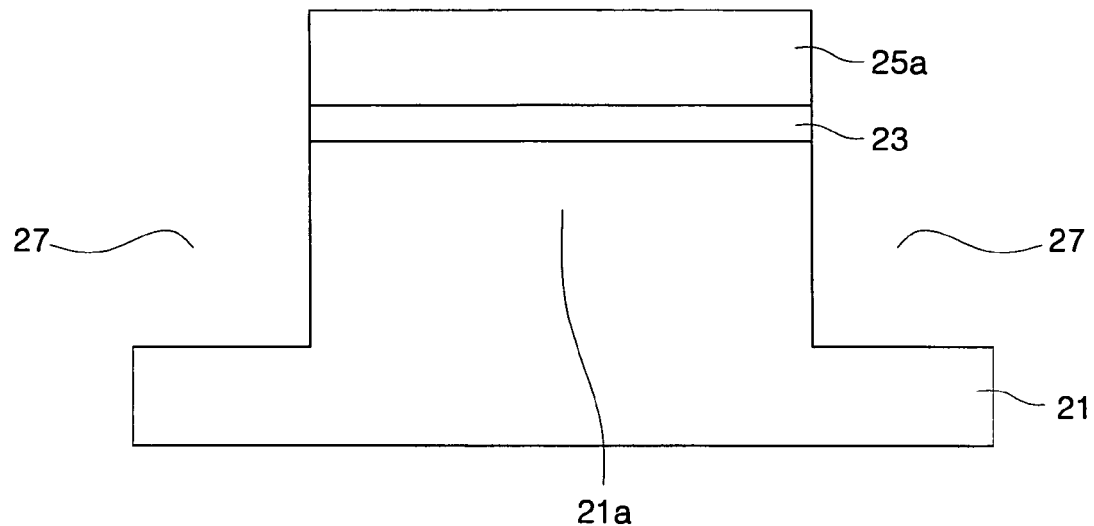
Figure 10B:
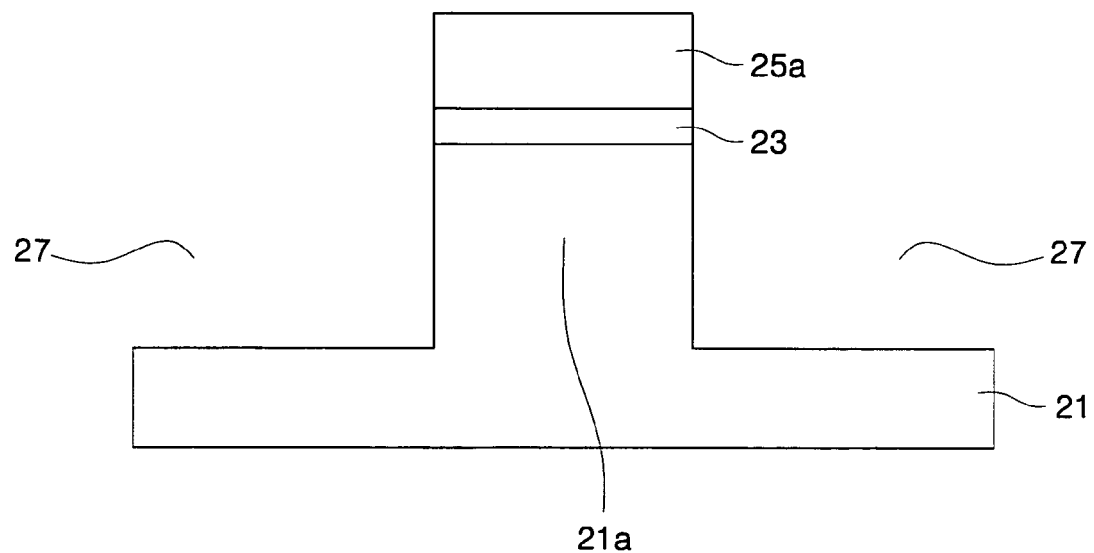

Referring to FIGS. 7, 10A and 10B, the semiconductor substrate 21 is etched using the hard mask pattern 25a as an etch mask to form a trench 27 defining an active region 21a. The semiconductor substrate 21 may be etched to a depth of about 3000 Å using an anisotropic etching process.

Further, when the thermal oxidation layer is formed, the upper corners of the active regions 21a are formed round-shaped. Accordingly, the electric field may be less concentrated on the corners of the active regions 21a.

Further, at least a portion of the active region 21a may be defined to have a width less than or equal to twice that of the maximum depletion layer. For this, at least a portion of the hard mask pattern 25a may be formed to have a width corresponding to the width less than or equal to twice that of the maximum depletion layer.

Figure 11A:
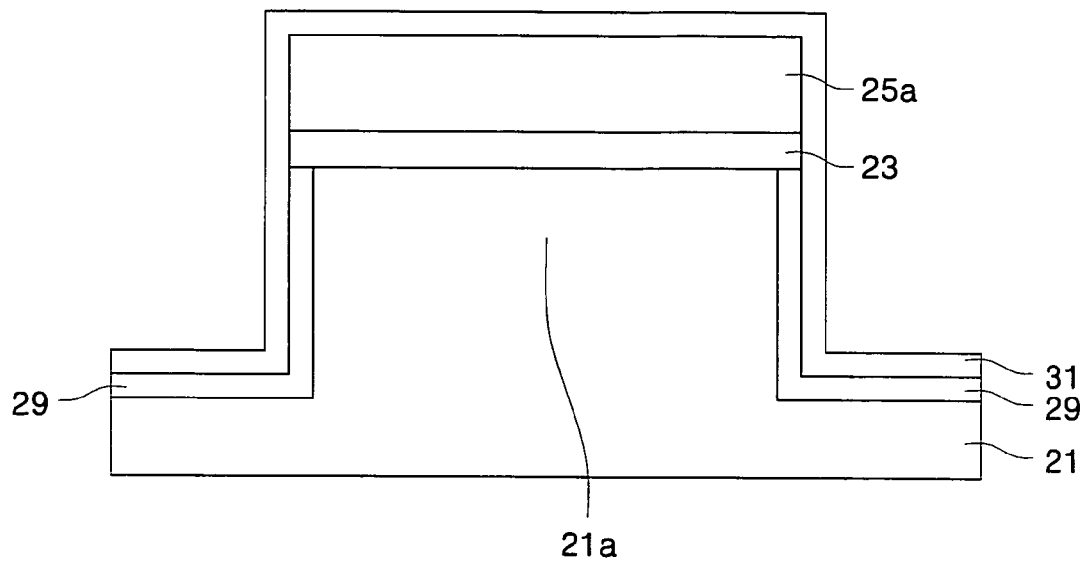
Figure 11B:
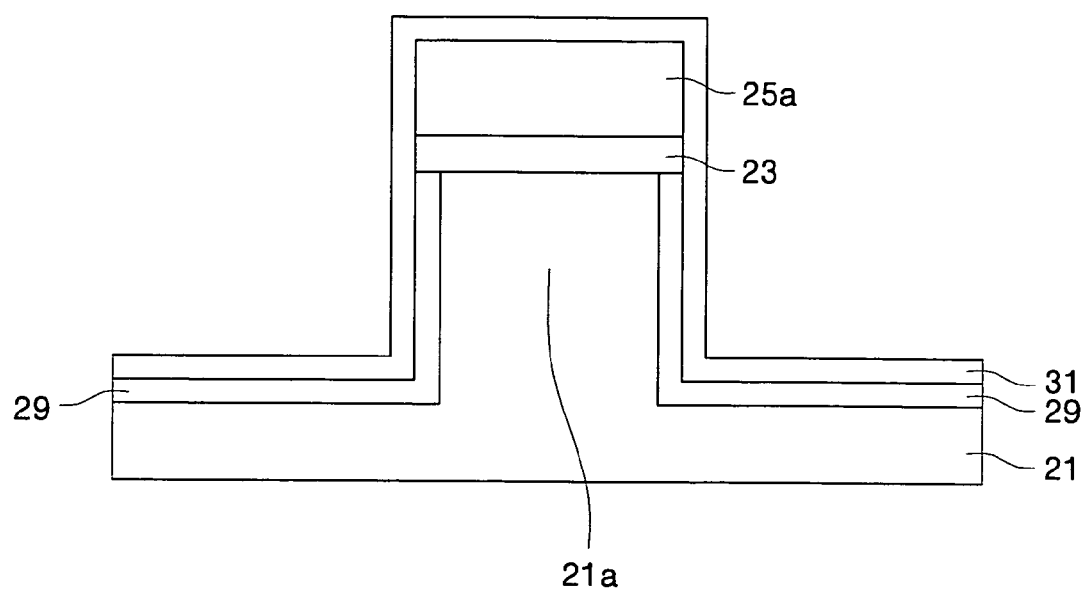

Referring to FIGS. 7, 11A and 11B, a trench oxide layer 29 and a liner 31 are sequentially formed on the semiconductor substrate having the trench 27. The trench oxide layer 29 may be formed by thermally oxidizing the semiconductor substrate 21 having the trench 27. The trench oxide layer 29 may be formed to recover the etch damage of the semiconductor substrate 21 during forming the trench 27.

Further, the liner 31 may be formed on the semiconductor substrate having the trench oxide layer 29 by a chemical vapor deposition method. The liner 31 may be formed of the same material layer, i.e., silicon nitride, as the hard mask layer 25. The liner 31 covers the trench oxide layer 29.

Figure 12A:
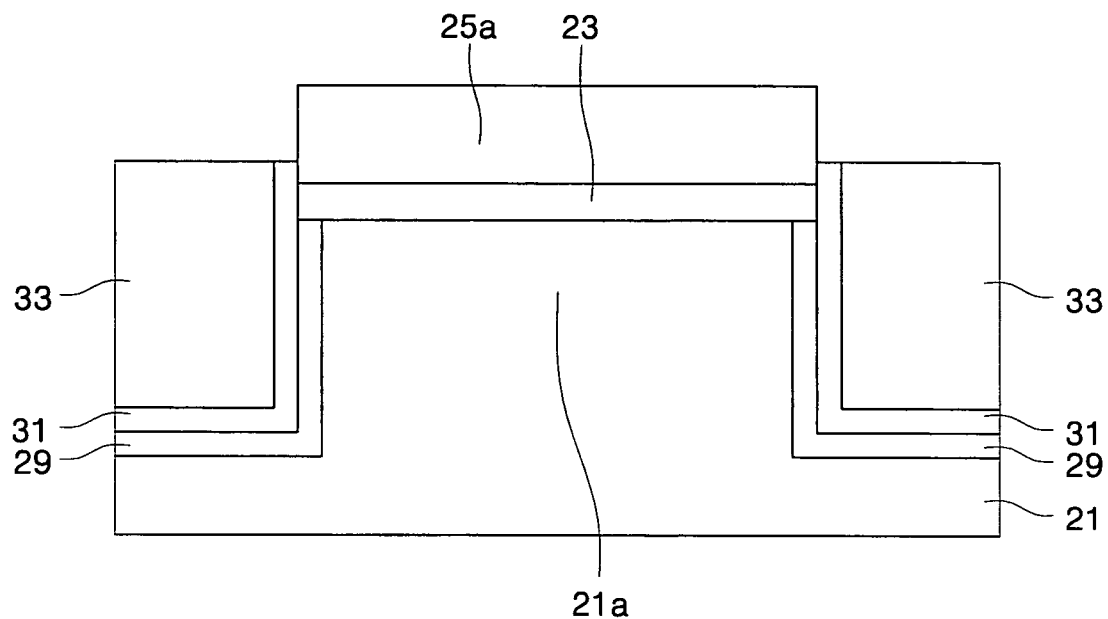
Figure 12B:
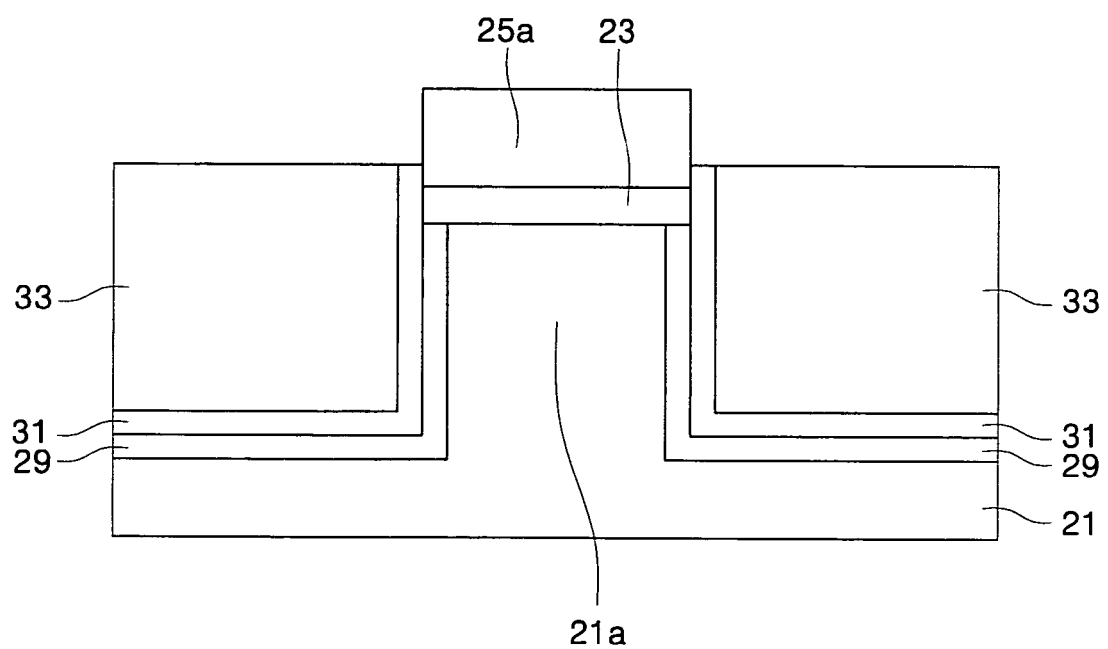

Referring to FIGS. 7, 12A and 12B, an insulating layer (not shown) that fills an empty space of the trench 27 is formed on the semiconductor substrate having the liner 31. The insulating layer may be formed of a silicon oxide layer by an HDP-CVD method. The insulating layer is then planarized until the upper surface of the hard mask pattern 25a is exposed. The planarized insulating layer may be recessed down below the upper surface of the hard mask pattern 25a to form an isolation layer 33. Here, some of the liner 31 that covers the sidewalls and the upper surface of the hard mask pattern 25a may also be removed.

Figure 13A:
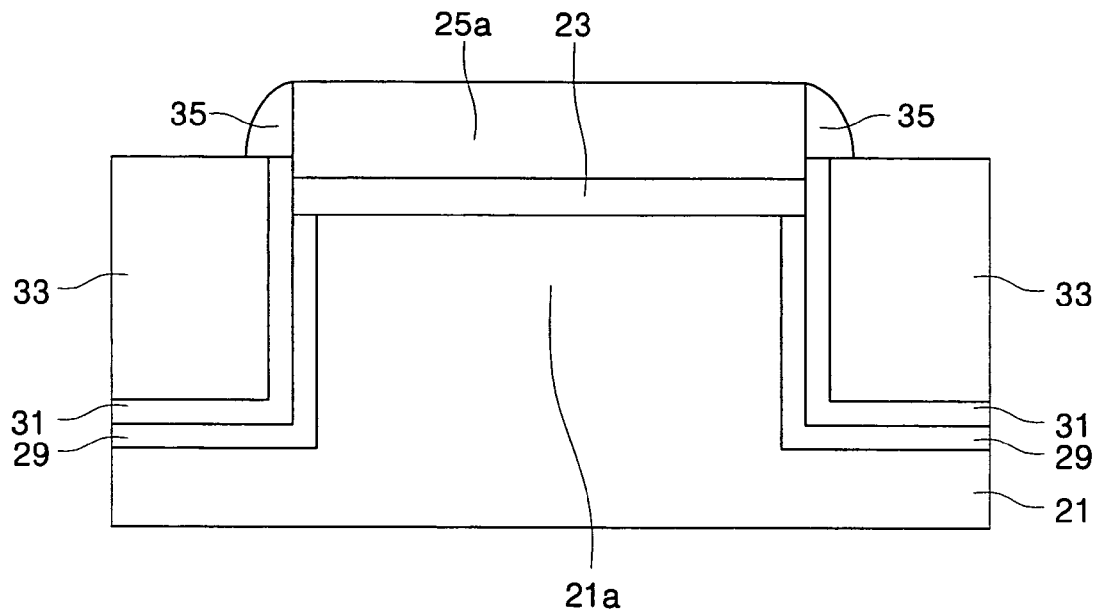
Figure 13B:
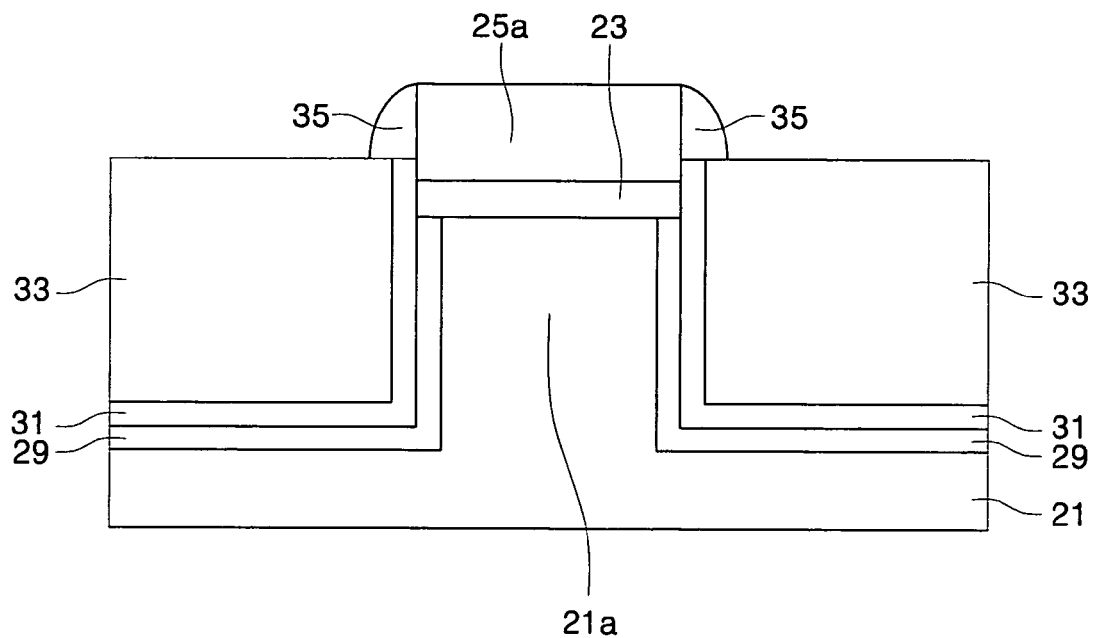

Referring to FIGS. 7, 13A and 13B, a spacer insulating layer (not shown) is formed on the semiconductor substrate having the isolation layer 33. Preferably, the spacer insulating layer is formed of a material having an etch selectivity with respect to the isolation layer 33. Further, the spacer insulating layer may be formed of the same material as the hard mask layer 25. The spacer insulating layer is blanket etched to form a hard mask spacer 35 that covers the sidewalls of the hard mask pattern 25a. Here, the hard mask spacer 35 may be located on the liner 31, which is on the sidewalls of the active region 21a. Further, some of the hard mask spacer 35 may be located on the isolation layer 33.

Figure 14A:
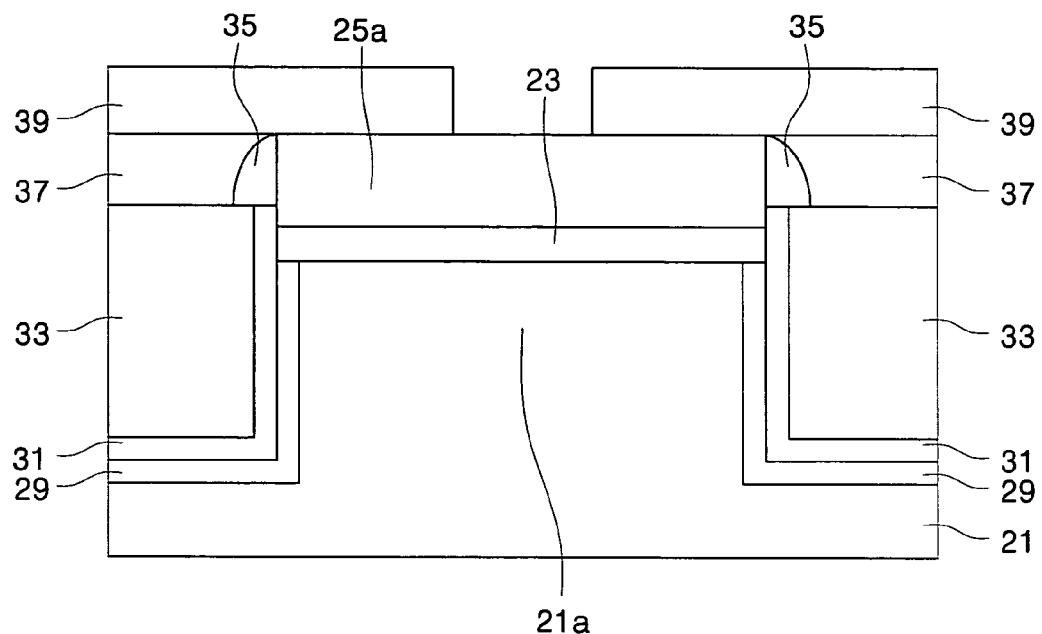
Figure 14B:
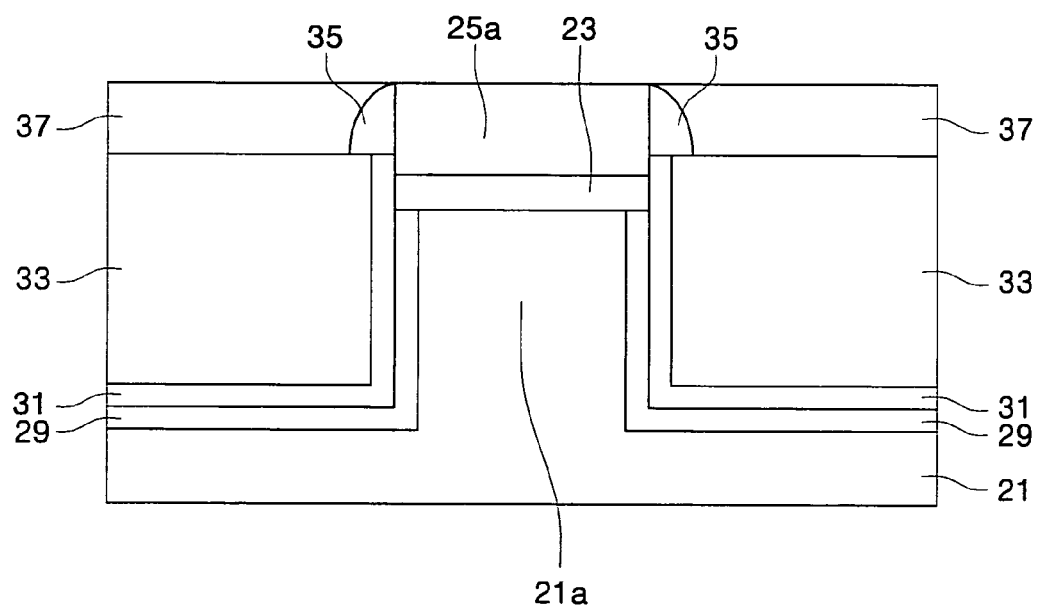

Referring to FIGS. 7, 14A and 14B, a mask pattern 39 having an opening that crosses the hard mask pattern 25a is formed on the semiconductor substrate having the hard mask spacer 35. The mask pattern 39 may be made of a photoresist. When the mask pattern 39 is made of the photoresist, an anti-reflective layer may be employed to form the photoresist pattern.

Further, before the mask pattern 39 is formed, an insulating layer (not shown) may be formed on the semiconductor substrate having the hard mask spacer 35. Then, the insulating layer is planarized until the upper surface of the hard mask pattern 25a is exposed to thereby form a gap filling layer 37 that covers sidewalls of the hard mask spacer 35. The gap filling layer 37 serves to reduce a step-difference between the hard mask pattern 25a and the isolation layer 33. As a result, the mask pattern 39 may be easily formed.

Figure 15A:
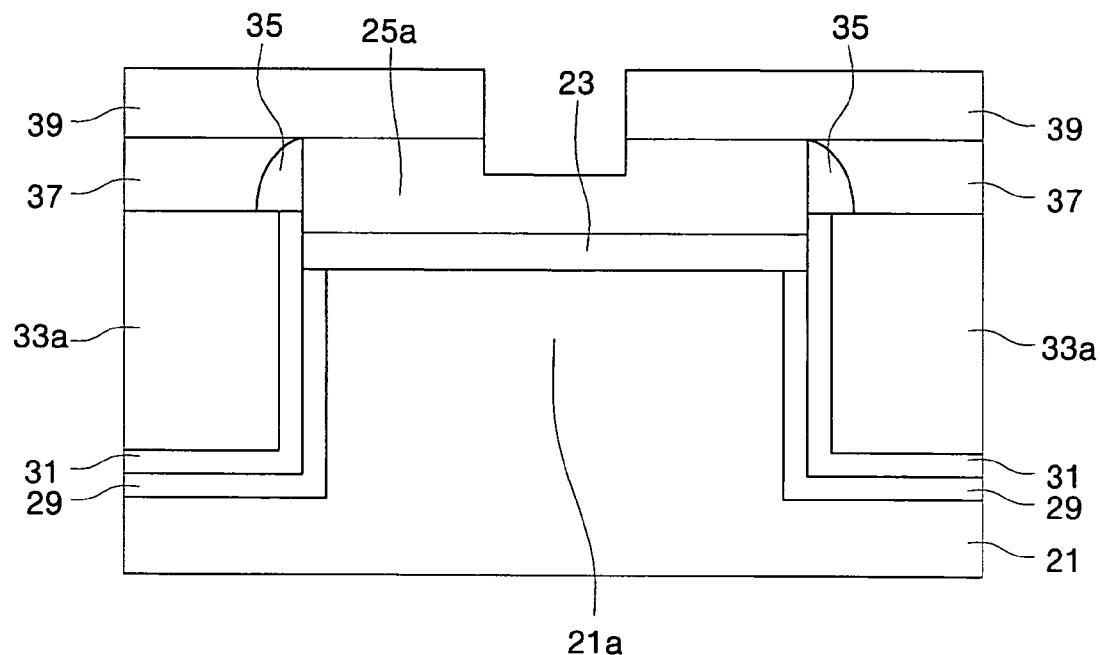
Figure 15B:
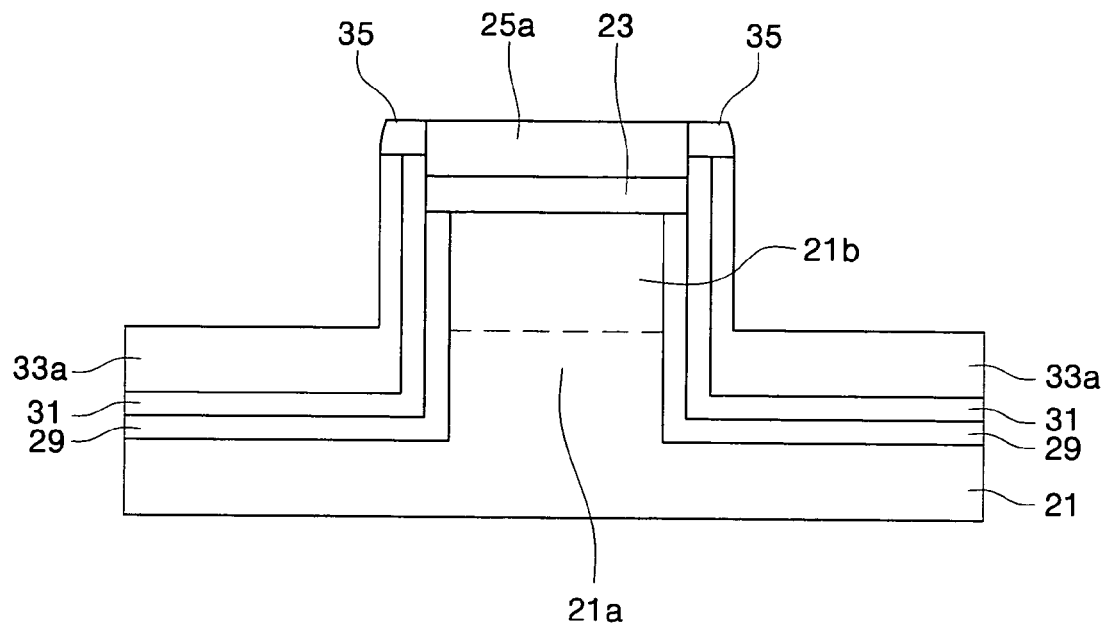

Referring to FIGS. 7, 15A and 15B, the gap filling layer 37 and the isolation layer 33 are etched using the mask pattern 39, the hard mask pattern 25a and the hard mask spacer 35 as etch masks to recess the isolation layer 33. As a result, the recessed isolation layer 33a is formed, and the recessed depth of the isolation layer 33 defines a height of a channel region 21b.

Further, some portions of the isolation layer 33 located below the hard mask spacer 35 are prevented from being etched. As a result, some portions of the isolation layer 33 in which etching is blocked remain on sidewalls of the channel region 21b, respectively, to prevent the liner 31 from being exposed. Therefore, the liner 31 is prevented from being damaged by etching.

Here, the hard mask pattern 25a and the hard mask spacer 35 may also be etched and recessed. However, preferably, at least some portions of the hard mask pattern 25a remain on the active region 21a.

Further, channel ions may be implanted onto the semiconductor substrate having the recessed isolation layer 33a. Here, the channel ions may be implanted into the channel region 21b through the hard mask pattern 25a over the channel region 21b. The upper surface of an active region 21a except the channel region 21b is covered by the mask pattern 39 and the hard mask pattern 25a. Therefore, the channel ions are prevented from being injected into the active region 21a except in the channel region 21b. Further, the channel ions may be implanted using various ion implantation energy, and at various angles.

Figure 16A:
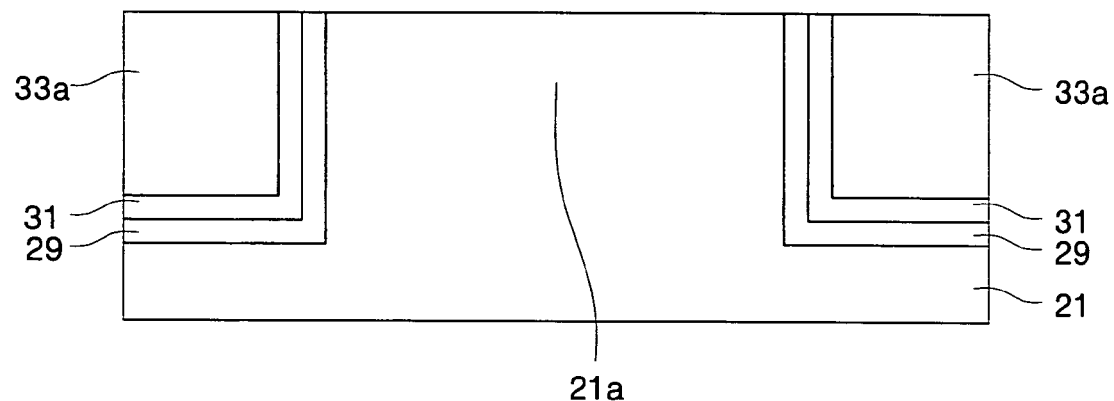
Figure 16B:
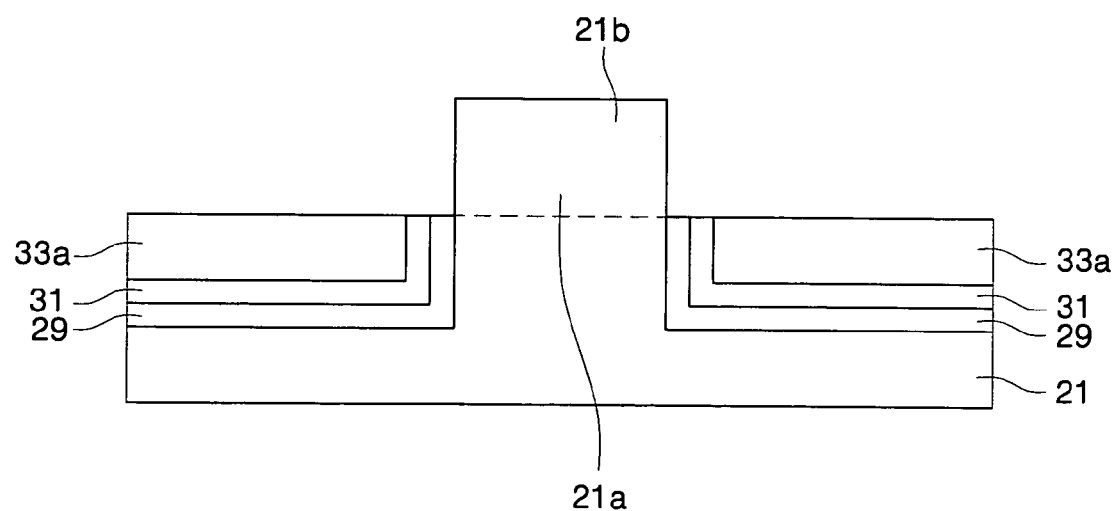

Referring to FIGS. 7, 16A and 16B, the mask pattern 39 is removed, after the recessed isolation layer 33a is formed. When the mask pattern 39 is made of photoresist, the mask pattern 39 may be easily removed by an ashing process. Meanwhile, the channel ions may be implanted after the mask pattern 39 is removed.

Next, some portions of the recessed isolation layer 33a that remain on the sidewalls of the channel region 21b are removed. Some portions of the recessed isolation layer 33a may be removed using an HF solution. As a result, the liner 31 is exposed. Here, the liner 31 prevents the trench oxide layer 29 from being damaged by the liner 31.

Then, the hard mask pattern 25a, the hard mask spacer 35 and the liner 31 on the sidewalls of the channel region 21b are removed. When the hard mask pattern 25a, the hard mask spacer 35 and the liner 31 are formed of a silicon nitride layer, the hard mask pattern 25a, the hard mask spacer 35 and the liner 31 may be etched with a phosphoric acid solution. Here, the trench oxide layer 29 prevents the channel region 21b from being damaged by etching.

Next, the trench oxide layer 29 that covers the sidewalls of the channel region 21b is removed. The trench oxide layer 29 may be removed using an HF solution. Further, the buffer layer 23 may also be removed while the trench oxide layer 29 is removed. As a result, the sidewalls of the channel region 21b are exposed, and the upper surface of the active region 21a is exposed.

Here, preferably, the recessed isolation layer 33a is recessed to have the same height as the upper surface of the active region 21a, except for the portions adjacent to the channel region 21a.

Figure 17A:
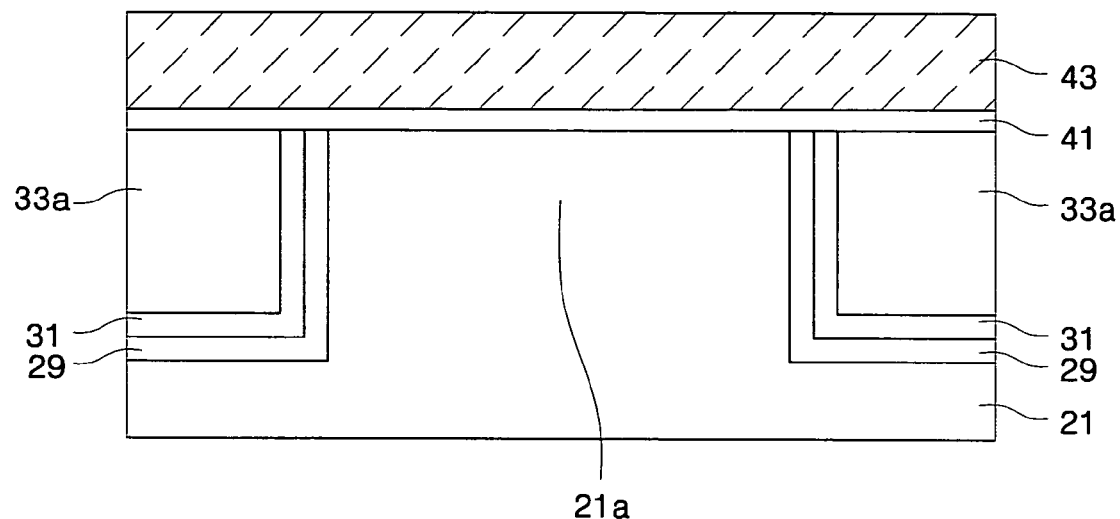
Figure 17B:
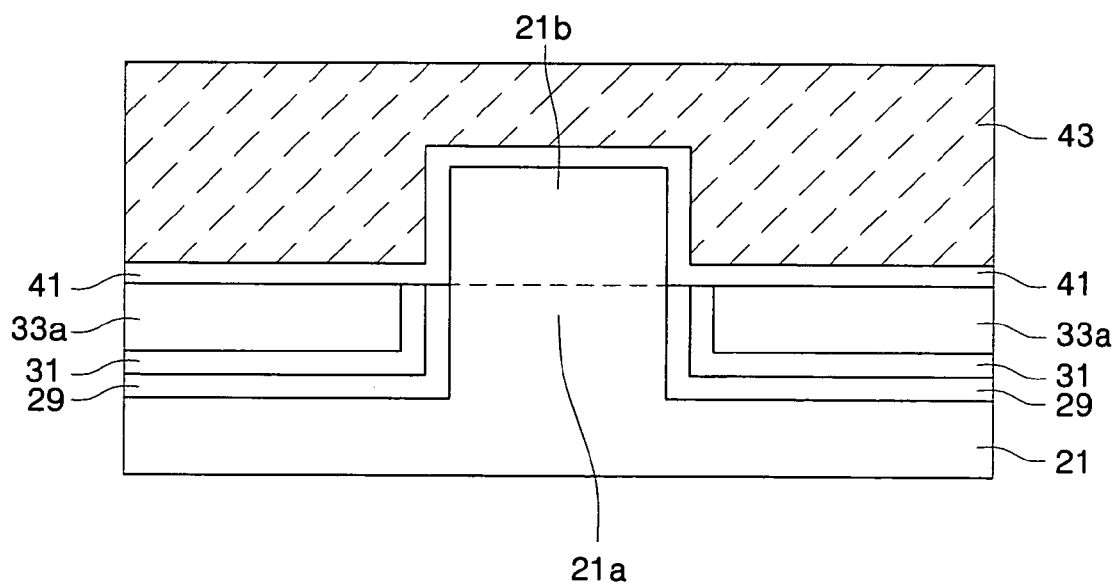

Referring to FIGS. 7, 17A and 17B, a gate insulating layer 41 is formed on the semiconductor substrate where the sidewalls of the channel region 21b and the upper surface of the active region 21a are exposed. The gate insulating layer 41 may be formed by oxidizing the semiconductor substrate 21 using a thermal oxidation process. Further, the gate insulating layer 41 may be formed of a silicon oxide layer or a high-k layer by an atomic layer deposition method or a chemical vapor deposition method.

A gate conductive layer 43 is formed on the semiconductor substrate having the gate insulating layer 41. The gate conductive layer 43 may be formed of a doped polysilicon. Further, the gate conductive layer 43 may be formed by depositing the doped polysilicon and a silicide. Here, the doped polysilicon fills a groove that is formed in the recessed isolation layer 33a adjacent to the sidewalls of the channel region 21b.

Figure 18A:
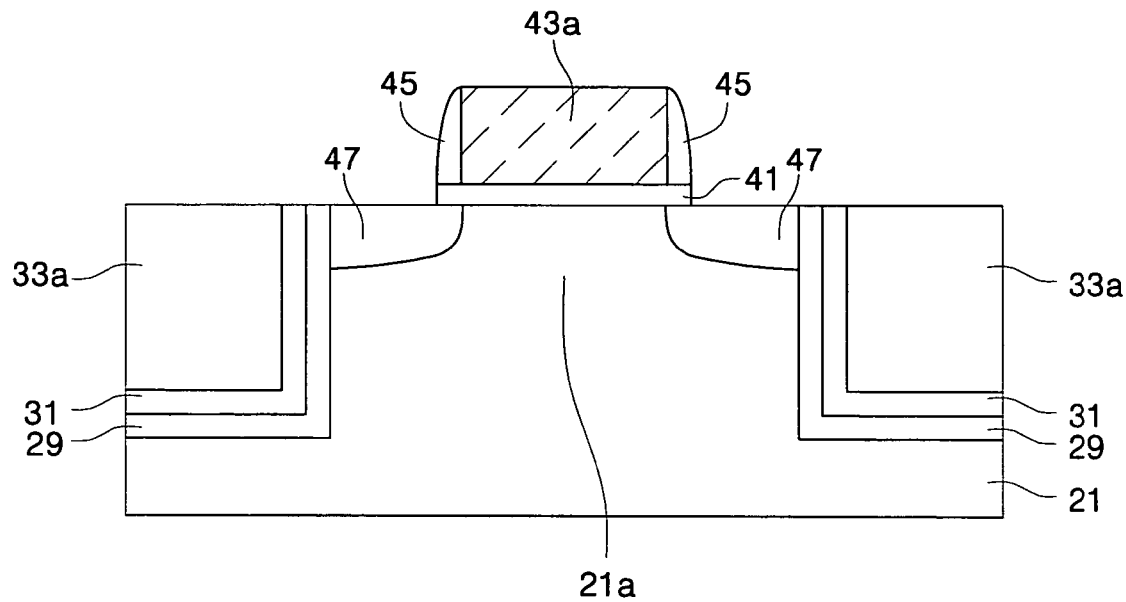
Figure 18B:
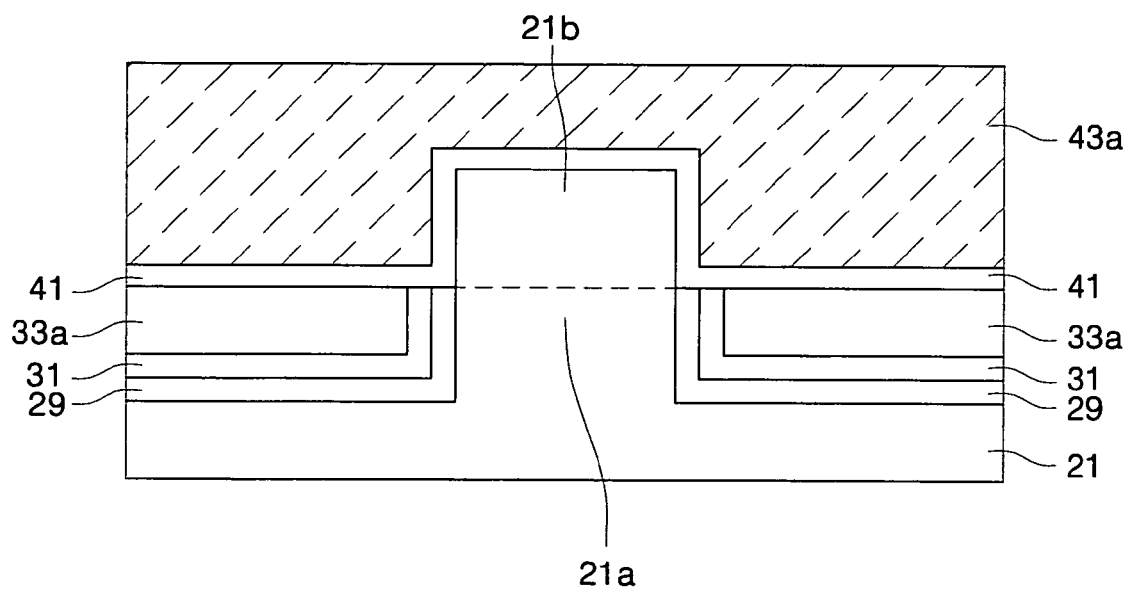

Referring to FIGS. 7, 18A and 18B, the gate conductive layer 43 is patterned to form a gate electrode 43a. To pattern the gate conductive layer 43, a hard mask layer (not shown) may be formed on the gate conductive layer 43. After the hard mask layer is patterned, the gate conductive layer 43 is etched using the patterned hard mask layer as an etch mask. As a result, the gate electrode 43a that covers the upper surface and the sidewalls of the channel region 21b is formed. Here, the gate insulating layer 41 may be etched also.

Further, a spacer insulating layer (not shown) may be formed on the semiconductor substrate having the gate electrode 43a. Then, the spacer insulating layer is blanket etched to form spacers 45 that cover sidewalls of the gate electrode 43a. Here, the gate insulating layer 41 may also be etched to expose the upper surface of the active region 21a.

Source/drain regions 47 are formed by implanting high-concentration impurity ions using the gate electrode 43a and the spacers 45 as ion implantation masks. Further, before the spacers 45 are formed, lightly doped drain (LDD) regions may be formed.

Next, an interlayer insulating layer (not shown) may be formed on the semiconductor substrate having the source/drain regions 47. Next, the source/drain electrodes (not shown) may be formed electrically connected to the source/drain regions 47 throughout the interlayer insulating layer. Consequently, the three-dimensional field effect transistor is completed.

According to the present invention, a method of fabricating a three-dimensional field effect transistor capable of preventing the sidewalls of the channel region from being damaged by etching while removing the hard mask pattern may be provided. Further, a method of fabricating the three-dimensional field effect transistor in which the channel ions are prevented from being injected into the source and drain regions may be provided.

Preferred embodiments of the present invention have been disclosed herein and, although specific terms are employed, they are used and are to be interpreted in a generic and descriptive sense only and not for purpose of limitation.

Accordingly, it will be understood by those of ordinary skill in the art that various changes in form and details may be made without departing from the spirit and scope of the present invention as set forth in the following claims.

What is claimed is:

1. A method of fabricating a three-dimensional transistor, comprising:
    forming a hard mask pattern on a semiconductor substrate;
    etching the semiconductor substrate using the hard mask pattern as an etch mask to form a trench that defines an active region;
    sequentially forming a trench oxide layer and a liner on the semiconductor substrate having the trench;
    forming an isolation layer to fill the trench, wherein the isolation layer has an upper surface recessed down from an upper surface of the hard mask pattern;
    forming a hard mask spacer to cover sidewalls of the hard mask pattern;
    forming a mask pattern having an opening that crosses the hard mask pattern; and
    etching the isolation layer using the mask pattern, the hard mask pattern and the hard mask spacer as an etch mask to define a channel region, wherein some portions of the isolation layer where the etching is blocked by the hard mask spacer remain on sidewalls of the channel region.

2. The method according to claim 1, further comprising:
    exposing an upper surface of the active region and the sidewalls of the channel region; and
    forming a gate electrode that covers the upper surface of the active region and the sidewalls of the channel region and is insulated from the channel region.

3. The method according to claim 2, wherein forming the gate electrode comprises:
    forming a gate insulating layer that covers the upper surface of the active region and the sidewalls of the channel region;
    forming a gate conductive layer on the semiconductor substrate having the gate insulating layer; and
    patterning the gate conductive layer.

4. The method according to claim 3, further comprising implanting impurity ions into the active region, using the gate electrode as an ion implantation mask, to form source/drain regions.

5. The method according to claim 4, further comprising forming spacers that cover sidewalls of the gate electrode before implanting the impurity ions.

6. The method according to claim 2, wherein exposing the upper surface of the active region and the sidewalls of the channel region comprises:
    removing the mask pattern;
    removing the some portions of the isolation layer;
    removing the hard mask pattern, the hard mask spacer and the liner; and
    removing the trench oxide layer on the sidewalls of the channel region.

7. The method according to claim 6, further comprising implanting channel ions into the channel region before or after removing the mask pattern.

8. The method according to claim 1, further comprising thermally oxidizing the semiconductor substrate before etching the semiconductor substrate, using the hard mask pattern as an etch mask.

9. The method according to claim 1, further comprising forming a gap filling layer that covers sidewalls of the hard mask spacer after forming the hard mask spacer.

10. The method according to claim 9, wherein forming the gap filling layer comprises:

forming an insulating layer on the semiconductor substrate having the hard mask spacer; and planarizing the insulating layer until the upper surface of the hard mask pattern is exposed.

11. The method according to claim 1, further comprising forming a buffer layer on the semiconductor substrate before forming the hard mask pattern.

12. The method according to claim 11, further comprising:

exposing an upper surface of the active region and the sidewalls of the channel region; and forming a gate electrode that covers the upper surface of the active region and the sidewalls of the channel region and is insulated from the channel region.

13. The method according to claim 12, wherein exposing the upper surface of the active region and the sidewalls of the channel region comprises:

removing the mask pattern;

removing the some portions of the isolation layer;

removing the hard mask pattern, the hard mask spacer and the liner; and removing the buffer layer that covers the upper surface of the active region, and the trench oxide layer that covers the sidewalls of the channel region.

14. The method according to claim 13, further comprising implanting channel ions into the channel region before or after removing the mask pattern.

15. The method according to claim 12, further comprising, after forming the hard mask spacer, forming a gap filling layer that covers the sidewalls of the hard mask spacer.

16. The method according to claim 11, wherein at least a portion of the active region has a width less than or equal to twice that of a maximum depletion layer; and wherein the channel region is defined within the at least a portion of the active region.

17. The method according to claim 16, further comprising:

exposing an upper surface of the active region and the sidewalls of the channel region; and forming a gate electrode that covers the upper surface of the active region and the sidewalls of the channel region, the gate electrode being insulated from the channel region.

18. The method according to claim 17, wherein exposing the upper surface of the active region and the sidewalls of the channel region comprises:

removing the mask pattern;

removing the some portions of the isolation layer;

removing the hard mask pattern, the hard mask spacer and the liner; and removing the buffer layer that covers the upper surface of the active region, and the trench oxide layer that covers the sidewalls of the channel region.

19. The method according to claim 18, further comprising implanting channel ions into the channel region before or after removing the mask pattern.

20. The method according to claim 17, further comprising forming a gap filling layer that covers sidewalls of the hard mask spacer after forming the hard mask spacer.

21. The method according to claim 1, further comprising:

forming the isolation layer after sequentially forming the trench oxide layer and the liner; and forming the hard mask spacer after forming the isolation layer.

* * * * *